United States Patent [19]

Gilmore

[11] Patent Number: 5,757,239
[45] Date of Patent: May 26, 1998

[54] DIRECT DIGITAL SYNTHESIZER DRIVEN PHASE LOCK LOOP FREQUENCY SYNTHESIZER WITH CLEAN UP PHASE LOCK LOOP

[75] Inventor: Robert P. Gilmore, San Diego, Calif.

[73] Assignee: Qualcomm Incorporated, San Diego, Calif.

[21] Appl. No.: 780,472

[22] Filed: Jan. 8, 1997

Related U.S. Application Data

[63] Continuation of Ser. No. 407,521, Mar. 16, 1995, abandoned.

[51] Int. Cl.$^6$ ............................................. H03K 3/80
[52] U.S. Cl. ........................... 331/18; 331/25; 331/2; 327/105; 327/106; 327/107; 375/376
[58] Field of Search ........................ 331/2, 14, 25, 331/18; 327/105, 106, 107, 156; 375/376

[56] References Cited

U.S. PATENT DOCUMENTS

| | | | |
|---|---|---|---|
| 4,114,110 | 9/1978 | Nossen | 331/2 |
| 4,263,565 | 4/1981 | Astle | 331/15 |
| 4,410,954 | 10/1983 | Wheatley, III | 364/701 |
| 4,413,236 | 11/1983 | Sochor | 331/25 |
| 4,516,084 | 5/1985 | Crowley | 331/2 |
| 4,835,491 | 5/1989 | Coster | 331/2 |
| 4,841,256 | 6/1989 | Gastgeb | 331/25 |
| 4,868,524 | 9/1989 | Costlow et al. | 331/16 |
| 4,965,533 | 10/1990 | Gilmore | 331/18 |
| 5,028,887 | 7/1991 | Gilmore | 331/18 |
| 5,152,005 | 9/1992 | Bickley | 455/76 |
| 5,353,311 | 10/1994 | Hirata et al. | 327/156 X |
| 5,541,929 | 7/1996 | Jokura | 370/95.3 |

FOREIGN PATENT DOCUMENTS

| | | | |
|---|---|---|---|
| 0019412 | 11/1980 | European Pat. Off. | H03L 7/18 |
| 0454917 | 11/1991 | European Pat. Off. | H03L 7/23 |
| 2671246 | 7/1992 | France | H03L 7/23 |

OTHER PUBLICATIONS

Bryan Bergeron "Direct Digital Synthesis", *Communications Quarterly*, Summer 1993, pp. 13–28.

Elizabeth C. Kisenwether et al., "Performance Analysis Of The Numerically Controlled Oscillator", 40TH Annual Frequency Control Symposium 1986, *IEEE*, New York, pp. 373–378.

V. Reinhardt et al., "A Short Survey Of Frequency Synthesizer Techniques", 40TH Annual Frequency Control Symposium 1986, *IEEE*, New York, pp. 355–365.

*Primary Examiner*—Robert Pascal
*Assistant Examiner*—Arnold Kinkead
*Attorney, Agent, or Firm*—Russell B. Miller; Roger W. Martin

[57] ABSTRACT

A frequency synthesizer which uses a direct digital synthesizer (DDS) to generate a highly accurate periodic signal of a frequency selected from a plurality of reference frequencies. The DDS output signal is bandpass filtered utilizing a clean-up phase lock loop (PLL) to produce a spectrally pure reference signal and promote overall fast settling time. A second or primary phase lock loop, having a much faster settling time than the first PLL, adjusts the frequency of the reference signal generated by the clean-up PLL. In one embodiment, the DDS frequency synthesizer has a digital to analog (DAC) converter coupled to the clean-up PLL. Another embodiment uses a modified DDS (without a DAC or lookup table) and feeds the most significant bit (MSB) or overflow bit from the DAC accumulator into the "clean-up" PLL. In both embodiments, the resulting synthesizer has high spectral purity, fine frequency resolution and a fast settling time. Yet another embodiment uses a switching apparatus to bypass the "clean-up" PLL while it is settling on a new frequency. Once the "clean-up" PLL settles on the new frequency the switches are set to couple the "clean-up" PLL back into the synthesizer apparatus.

8 Claims, 4 Drawing Sheets

DIRECT DIGITAL SYNTHESIZER DRIVEN PHASE LOCK LOOP FREQUENCY SYNTHESIZER WITH CLEAN UP PHASE LOCK LOOP

This is a continuation of application Ser. No. 08/407,521, filed Mar. 16, 1995, now abandoned.

BACKGROUND OF THE INVENTION

I. Field of the Invention

The present invention relates to frequency synthesizers. More particularly, the present invention relates to a novel and improved apparatus and method for frequency synthesis utilizing a direct digital synthesizer in combination with one or more phase lock loops.

II. Description of the Related Art

Conventional frequency synthesis may be accomplished using a direct digital synthesizer in combination with a phase lock loop. Direct digital synthesizers (DDS) can be used to provide a loop reference signal for the phase lock loop. Ideally, a phase lock loop (PLL) is designed to reject spurs from the DDS reference signal, operate over a wide frequency range and achieve a rapid settling time. Achieving all these design goals, however, may be difficult utilizing a single PLL in combination with a DDS. A PLL designed to settle quickly on a new frequency is often unable to reject a wide range of spurs found on the DDS reference signal. Decreasing the frequency settling time and increasing spur rejection present conflicting design requirements in a PLL device.

The DDS reference signal is a digitized periodic signal whose frequency can be finely tuned over a given bandwidth. This signal is produced by accumulating phase at a higher rate consistent with sampling theory, translating the phase into a periodic waveform via a lookup table, and converting the resulting digital representation of the periodic waveform to an analog signal using a digital to analog converter. The DDS output signal, however, may contain spurs due to quantization errors and truncation as well as noise due to thermal and semiconductor effects.

The analog signal, produced by the DDS, is the reference frequency source for the PLL. A PLL is designed to output a range of frequencies where the frequency resolution is equal to the reference frequency. Coarse output frequency adjustments in increments of the nominal DDS reference frequency, may be made by varying the loop divisor value. The fine frequency adjustments may be made by varying the DDS output frequency, e.g. the source of the phase lock loop reference frequency. The fine adjustment increment is the frequency resolution of the DDS output multiplied by the value of the loop division.

The performance of a phase lock loop is related to several factors including (1) the frequency of the reference signal, (2) the magnitude of the divisor necessary to divide the output frequency down to the reference frequency, and (3) the bandwidth of the loop filter. The frequency of the reference signal dictates the frequency resolution, or step size of the loop, i.e. the smaller the reference frequency, the greater the frequency resolution. The magnitude of the loop divisor has great impact on the noise performance of the loop. As such, any phase noise or spurious noise in the reference frequency will appear in the loop output having its original magnitude multiplied by the loop divisor. The bandwidth of the loop filter, which is normally five to ten percent of the reference frequency or less, impacts the speed with which the loop can settle on a new frequency. Thus the narrower the loop filter bandwidth, the slower the loop will be able to settle on the new frequency.

The conventional DDS driven PLL synthesizer can synthesize signals with fine frequency resolution and high spectral purity. A PLL designed with a narrow bandwidth loop rejects noise and spurs from the DDS reference signal and produces a signal with high spectral purity. Examples of DDS driven PLL synthesizers are provided in U.S. Pat. No. 4,965,533 entitled "DIRECT DIGITAL SYNTHESIS DRIVEN PHASE LOCK LOOP FREQUENCY SYNTHESIZER" and U.S. Pat. No. 5,028,887 entitled "DIRECT DIGITAL SYNTHESIZER DRIVEN PHASE LOCK LOOP FREQUENCY SYNTHESIZER WITH HARD LIMITER" which are by the present inventor assigned to assignee of the present invention and incorporated herein by reference. The small bandwidth loop required to obtain high spectral purity, however, tends to increase frequency settling time. In a conventional DDS driven PLL synthesizer, fast settling time and high spectral purity presents conflicting design requirements.

It is therefore an object of the present invention to provide a novel and improved direct digital synthesizer driven phase-lock loop frequency synthesizer capable of achieving a fast settling time while producing a signal with high spectral purity.

It is another object of the present invention to provide a novel and improved direct digital synthesizer driven phase lock loop frequency synthesizer where the direct digital synthesizer does not require the use of a digital-analog-converter.

A further object of the present invention is to utilize a switching arrangement to reduce the settling time of an improved direct digital synthesizer driven phase lock loop frequency synthesizer.

SUMMARY OF THE INVENTION

An improved frequency synthesizer uses a pair of phase lock loop circuits to process a digitally generated analog signal. A direct digital synthesizer (DDS) is one method of producing the digital reference signal. The DDS produces digitized periodic frequencies by accumulating phase at a higher rate consistent with sampling theory, translating the phase into a periodic waveform via a lookup table, and converting the resulting digital representation of the periodic wave to an analog signal using a digital to analog converter.

In the first embodiment, the first or clean-up PLL coupled to the DDS frequency source cleans up close-in noise around the reference frequency. The clean-up PLL offers advantages over conventional filter arrangements because it will inherently track the provided reference frequency. Filtering capabilities of a PLL depends on the size of the loop bandwidth. A narrower PLL loop bandwidth will filter out frequencies in a smaller window around the reference frequency. Typically, the clean-up PLL produces an output signal close to, or the same as, the input reference frequency by setting the loop divisor value to substantially unity. A clean-up PLL will provide a spectrally pure reference signal independent of any additional filters that may be required by other conventional synthesizers.

A second or primary PLL circuit accepts the spectrally pure reference signal from the clean-up PLL and adjusts the frequency as needed. The PLL circuit adjusts the output frequency, in increments of the input reference frequency, by adjusting the loop divisor value to values substantially greater than unity. A frequency control input to the primary PLL can be used to dynamically make coarse adjustments to the output frequency. Fine frequency control can be achieved by adjusting the DDS reference frequency used as input to the first of the PLL circuits.

The overall settling time for the present embodiment to lock onto a new signal depends on the loop bandwidth of each PLL and the individual probability each PLL will lose lock with the provided signal. The clean-up PLL produces an output frequency closely matching the input reference frequency and during operation will typically not lose lock. As a result, the longer settling time associated with the clean-up PLL's narrow loop bandwidth does not contribute significantly to the overall settling time equation. The primary PLL, which typically does break signal lock when making large frequency adjustments, reduces settling time by having an arbitrarily large loop bandwidth.

The settling time of the present embodiment is greatly improved by utilizing two PLL circuits. Conventional DDS driven PLL synthesizer designs, typically using only one PLL, are constrained by mutually exclusive close-in filtering and fast frequency settling time design requirements. In present embodiment a clean-up PLL separates the close-in filtering function from the fast frequency settling time requirement and thus adds an additional degree of freedom to the settling equation for a frequency synthesizer. The primary PLL in the present embodiment is no longer required to perform close-in filtering and instead can be designed to have an arbitrarily fast frequency settling time.

The present embodiment may also be used to simplify design requirements for digital reference frequency synthesizers. A typical digital frequency synthesizer comprises a direct digital synthesizer (DDS) coupled to a digital to analog converter (DAC) element. The present embodiment will also work with a frequency synthesizer not utilizing a DAC. Instead of utilizing the DAC output, the most significant bit (MSB) from the DDS accumulator is provided directly to the clean-up PLL. The filtering qualities of the clean-up PLL eliminate harmonic spurs present on the DDS MSB signal and produces a sine-wave signal. The resulting sine-wave signal can readily be used by the primary PLL for further signal processing.

An alternative embodiment utilizes a switching apparatus to minimize any settling time which may be contributed by the clean-up PLL in the present invention. This embodiment uses a power splitter means for creating a first and second duplicate of the digitally generated periodic signal. The first duplicate periodic signal is provided to the clean-up PLL and a subsequent switching means for selectively passing the signal through a power summer means and to the primary PLL circuit. This switching means is responsive to a control signal produced by a switching control circuit.

The second duplicate periodic signal is provided directly to a switching means capable of selectively passing the signal through a summer means and to the primary PLL circuit. This switching means is also responsive to a control signal produced by a switching control circuit.

This switching embodiment bypasses the clean-up PLL while it settles on the new frequency. This reduces the overall settling time by eliminating settling time delay which may be contributed by the clean-up PLL. When a frequency change occurs the switching control produces control signals which opens the switch associated with the clean-up PLL and closes the switch associated with the second duplicate periodic signal. Once the cleanup PLL has settled onto the new frequency, the switch associated with the clean-up PLL closes and the switch associated with the second duplicate periodic signal then opens.

The preferred embodiments of the present invention provide several advantages over the prior art. The settling time can be improved by using one PLL as a "clean-up" filter for the DDS reference signal and a second PLL as frequency multiplier. A clean-up PLL removes DDS spurs while continuously tracking the phase continuous DDS output. Maintaining frequency and phase lock between the clean-up PLL and the DDS output minimizes the settling time of this loop. Meanwhile, a second PLL operates as a frequency multiplier. Increasing the loop bandwidth in the second PLL allows a wide frequency bandwidth output along with a fast frequency switching characteristic.

BRIEF DESCRIPTION OF THE DRAWINGS

The features, objects, and advantages of the present invention will become more apparent from the detailed description set forth below when taken in conjunction with the drawings in which like reference characters identify correspondingly throughout and wherein.

DETAILED DESCRIPTION OF THE PREFERRED EMBODIMENTS

Figure 1:
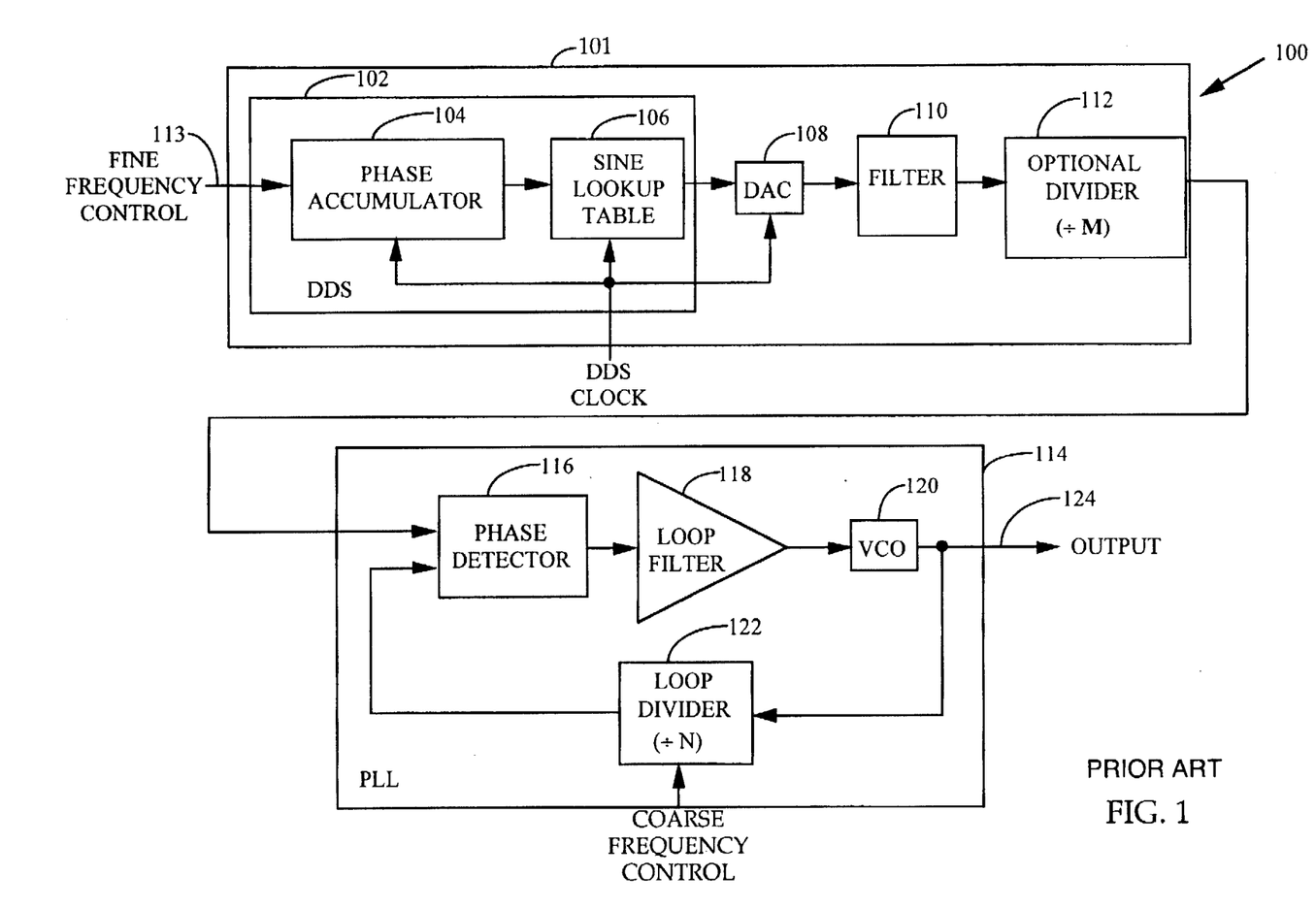
FIG. 1 illustrates a prior art direct digital synthesizer (DDS) driven phase lock loop (PLL) frequency synthesizer.

The preferred embodiment of the present invention provides many advantages over prior art frequency synthesizers. FIG. 1 illustrates in block diagram a conventional direct digital synthesizer (DDS) driven phase lock loop (PLL) frequency synthesizer 100. Synthesizer 100 typically comprises a frequency synthesizer 101 and a phaselock loop circuit (PLL) 114 used in combination to provide a desired synthesized output frequency 124.

Frequency synthesizer 101 is typically comprised of DDS 102, digital to analog converter (DAC) 108, filter 110 and optionally a frequency divider 112. In the embodiment illustrated in FIG. 1, DDS 102 is comprised of phase accumulator 104 and sine lookup table 106. It should be noted that DAC 108 is external to DDS 102 but an alternative design (not illustrated) could include a DAC within the DDS device.

In operation, DDS 102 in FIG. 1 receives a fine frequency control signal 113 which determines the phase increment for accumulation in phase accumulator 104. The accumulated phase value is output to sine lookup table 106, typically a read only memory which stores sine values, at the provided DDS clock rate. Sine lookup table 106 provides an output signal, also at the DDS clock rate, to an external digital to analog converter (DAC) 108. The output signal, produced by sine lookup table 106, is a digital representation of a periodic waveform. DAC 108 converts the digital representation of the periodic waveform into an output reference signal which is an analog amplitude value representation of the periodic waveform. Ultimately, fine frequency control signal 113 alters the reference frequency signal generated by DDS 102.

PLL 114 is comprised of phase detector 116, loop filter 118, voltage controlled oscillator (VCO) 120 and loop divider 122. The output of phase detector 116 is coupled to an input of loop filter 118, typically constructed as an op amp filter. The output of loop filter 118 is coupled to the control input of a VCO 120. The output of VCO 120 is provided as the phase lock loop output signal and is also fed back to an input of loop divider 122. The output of loop divider 122 is coupled to the other input of phase detector 116.

Phase detector 116 serves as a comparator means for comparing the DDS circuitry provided reference signal to the divided loop output signal. Phase detector 116 is responsive to a difference in frequency of the reference signal from the DDS circuitry and the divided loop output signal for generating a frequency tuning control signal whose voltage level is proportional to the frequency differential of the compared signals.

Loop filter 118 serves as a tuning control signal filter. Loop filter 118 receives and filters the frequency tuning control signal and provides a VCO control signal. The VCO control signal is provided to the voltage control input of VCO 120.

VCO 120 serves as a frequency generation means for generating the loop output signal in response to the VCO control signal. Specifically, VCO 120 alters the frequency of the loop output signal in response to a change in the voltage level of the input VCO control signal. VCO 120 may be a high quality voltage controlled oscillator (VCO) such as a voltage controlled crystal oscillator (VCXO) as needed for additional spectral purity requirements. The VCO control signal is provided to the voltage control input of VCO 120.

Loop divider 122 is coupled to the output of VCO 120 so as to receive the loop output signal. Loop divider 122 serves as a loop divider means which receives the loop output signal and generates a divided loop signal which corresponds in frequency to the loop output signal divided by N. The loop signal is provided to the other input of phase detector 116 and has frequency at or near the input value. Loop divider 122 is responsive to a coarse frequency control signal 126 for setting the integer divisor value by which the loop output signal frequency is divided for feedback to phase detector 116. Changing the loop divisor value N of loop divider 122 effectively increases the difference in the frequency differential perceived by phase detector 116 and causes a frequency change in the final output frequency 124. The resulting output signal 124 from VCO 120 in PLL 114 is a spectrally pure reference signal stepped up in frequency in proportion to loop divisor value N.

A conventional synthesizer design, as illustrated in FIG. 1, utilizing a single PLL 114 must balance settling time with spectral purity to produce desired output signal 124. Both the settling time, the time for a PLL to change frequencies, and the signal's spectral purity depend on the value of PLL 114 loop bandwidth. Increasing the loop bandwidth of PLL 114, for example, enables the PLL, and consequently the synthesizer as a whole, to settle onto a new frequency during a proportionally smaller time interval. Settling time in a PLL is inversely proportional to the loop bandwidth. Therefore, a proportionally larger loop bandwidth results in a proportionally faster settling time.

Obtaining an output signal 124 from synthesizer 100 with high spectral purity, however, requires a PLL with a relatively smaller loop bandwidth. DDS 102 typically produces frequency spurs close-in to the reference frequency generated. These spurs, in turn, are enhanced in proportion to the size of PLL 114's loop divisor and filtered based on the relative size of the PLL loop bandwidth. A narrower loop bandwidth will reduce spurs based upon the lowpass filtering characteristics, about the reference frequency, of PLL 114. However, if PLL 114 loop bandwidth is reduced to eliminate close-in spurs generated by DDS 102 frequency settling time is increased. Although the PLL having a wide loop bandwidth will clean up a noisy VCO, such as VCO 120, it must be narrow to clean- up noise produced by DDS 102.

Figure 2:
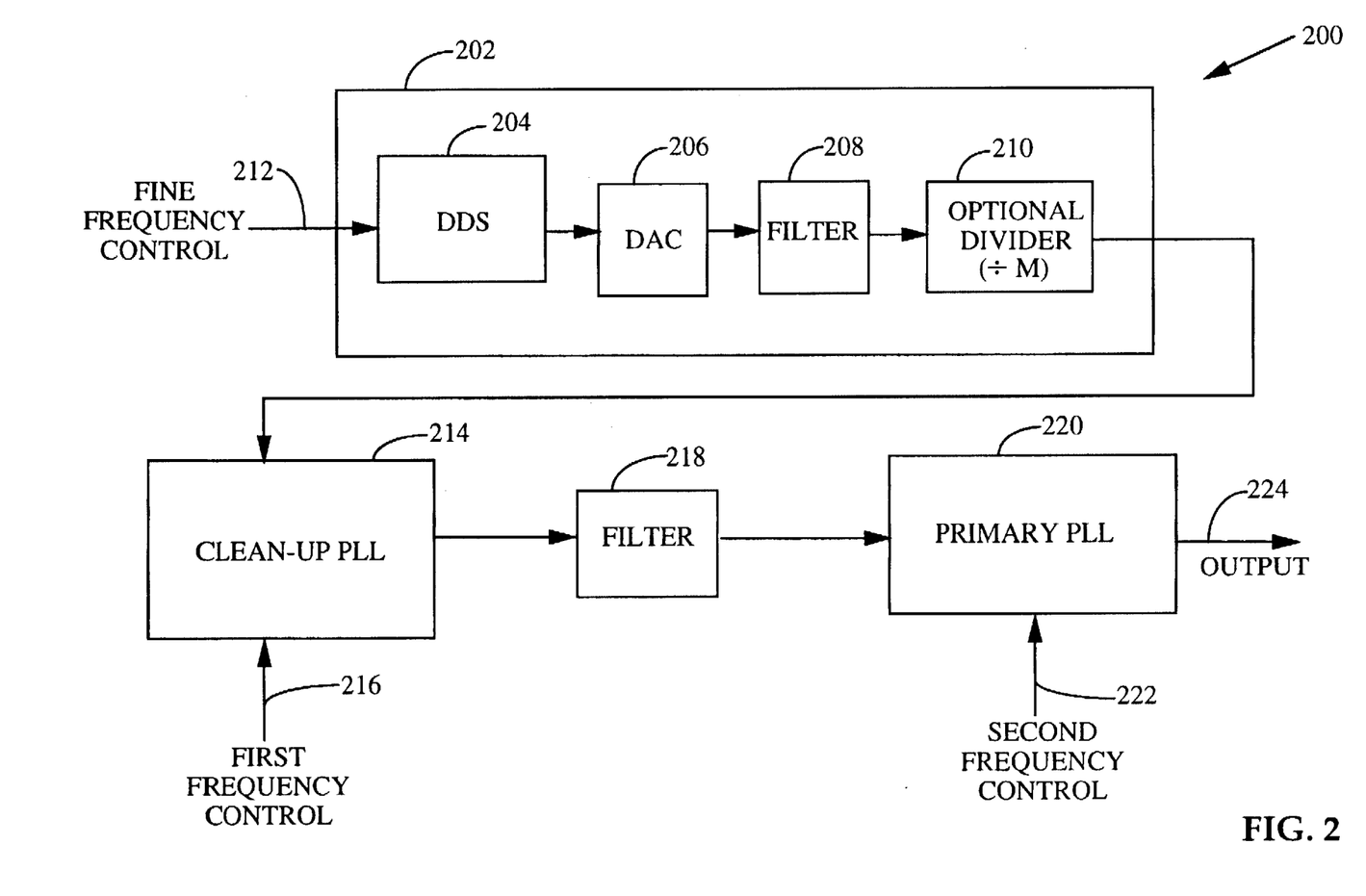
FIG. 2 illustrates one embodiment of the present invention for a DDS driven (PLL) frequency synthesizer with a clean-up PLL.

The preferred embodiment, as illustrated in FIG. 2, meets the needs of the these two conflicting variables, spectral purity and settling time, by utilizing two separate PLLs. A first or clean-up PLL 214 is designed to "cleanup" or filter the incoming variable reference signal generated by frequency synthesizer 202. Clean-up PLL 214 is designed with a narrow loop bandwidth and small loop divisor value. As mentioned previously, a PLL designed with a narrow loop bandwidth produces a signal having high spectral purity by reducing close-in spurs generated, in this case, by DDS 204 located in frequency synthesizer 202. A second PLL, such as primary PLL 220, having a large loop divisor and a large loop bandwidth can then be used to step up the reference frequency with a quick settling time interval. This design, unlike previous art, does not require one to sacrifice settling time at the expense of spectral purity or vice-versa. In the preferred embodiment the settling time and spectral purity are substantially separate parameters which can be independently specified by the synthesizer designer.

FIG. 2 illustrates an exemplary embodiment of a DDS driven PLL frequency synthesizer 200. The synthesizer 200 comprises a digital frequency synthesizer 202, a first or clean-up PLL 214, and a second or primary PLL 220. Additional filters well known in the art may be added as required by the particular design.

Digital frequency synthesizer 202 is comprised of direct digital synthesizer (DDS) 204, digital to analog converter (DAC) 206, filter 208 and an optional divider 210. Digital synthesizer 202 serves as a variable reference source means for generating a selected one of a plurality of reference frequency signals, each at a different frequency.

DDS 204 provides an output signal indicative of the digital representation of a periodic waveform. The components and operation of DDS 204 are similar to DDS 102 in FIG. 1. DDS 204 is responsive to a fine frequency control signal 212 capable of altering the frequency of the output reference signal. DDS 204 is further responsive to a direct digital synthesizer (DDS) clock signal with which its internal digital hardware is driven. The direct digital synthesizer is well known in the art.

DAC 206, coupled to DDS 204, converts the digital representation of the periodic waveform output by DDS 204 into an analog representation of the waveform. The digital to analog conversion performed by DAC 206 substantially reduces quantization errors present on the output signal of DDS 204.

Filter 208, coupled to DAC 206, typically reduces wideband noise present on the DAC 206 output signal. The noise eliminated by filter 208 is normally outside the bandwidth of subsequent first PLL 214 or second PLL 220. Optionally, the output from filter 208 is provided to a reference frequency divider 210 having a divisor value M. The resulting periodic output frequency and noise surrounding the signal, if processed by optional frequency divider 210, is stepped down in proportion to a predetermined integer value M.

The output reference signal provided by synthesizer 202, either filter 208 or optional frequency divider 210, is provided to the input of clean-up PLL 214. Unlike PLL 114, in FIG. 1, the primary function of clean-up PLL 214 is to serve as a lowpass filter that can track a range of phase continues input frequencies, such as those generated by frequency synthesizer 202. Given a phase continuous variable frequency input signal, clean-up PLL 214 provides a spectrally pure output frequency while maintaining frequency and phase lock. In an exemplary embodiment, substantially small frequency multiplication is performed by clean-up PLL 214.

The components and operation of PLL 214 are similar to PLL 114 in FIG. 1 with two exceptions: the PLL loop divider value and the PLL loop bandwidth. The loop divider value, indicated by the value N in PLL 114 of FIG. 1, of clean-up PLL 214 is intentionally set to a small value substantially near unity since the frequency multiplication function is performed primarily by a primary PLL 220. The clean- up PLL 214 loop divider value is set in response to a first frequency control signal 216. In an exemplary embodiment, the output from clean-up PLL 214 produces a spectrally pure reference signal at a frequency substantially near its input frequency.

Clean-up PLL 214 typically is designed with a small or narrow loop bandwidth. The size of the loop bandwidth is selected sufficiently small in order to filter out substantially all close-in noise around the carrier frequency created by the frequency signal synthesizer 202 or more specifically DDS 204. In comparison, the clean-up PLL has a significantly smaller loop bandwidth than a conventional synthesizer's PLL, such as PLL 114 found in synthesizer 100 in FIG. 1. The difference in bandwidth accounts for the increased spectral purity available to synthesizers using a clean-up PLL. The single PLL used in conventional synthesizers, such as PLL 114 in FIG. 1, do not typically have an arbitrarily small loop bandwidth because they would suffer an arbitrarily large increase in settling time.

The output signal of clean-up PLL 214 may be coupled through additional filter 218 before being input to primary PLL 220. Filter 218 serves as a means for further increasing the spectral purity of the enhanced reference signal output by PLL 214. An exemplary filter 218 may be either a lowpass filter (LPF) or a bandpass filter (BPF) as is well known in the art.

The output of filter 218 is coupled to a second or primary PLL 220. Generally, PLL 220 is used as a frequency tuning means for generating a loop output signal having a periodic frequency which is an integer multiple of the frequency of the input reference signal. In this particular embodiment, primary PLL 220 steps-up, or multiplies, a signal having frequency generated by DDS 202 and close-in spectral purity provided by clean-up PLL 214.

The components of PLL 220 are similar to the components of clean-up PLL 214 with two exceptions. Primary PLL 220 has a much larger loop divisor and a much larger loop bandwidth than clean-up PLL 216.

The range of loop divider values in primary PLL 220 differ from the range of loop divider values in clean-up PLL 214. In clean-up PLL 214, the loop divider value is set to near unity to create a narrow loop bandwidth and produce a output signal with high spectral purity. Clean-up PLL 214 is used primarily as a filter means and not a frequency multiplication means. Primary PLL 220, however, requires a loop divisor value which is much larger than unity in order to step up the input frequency to the higher desired output frequency. The primary PLL in the preferred embodiment is used primarily as a frequency multiplication means and not as a filter means.

In the preferred embodiment, a higher frequency multiplication may be achieved by setting a larger primary PLL loop divisor value. Generally, a PLL will increase noise as well as step up frequency in proportion to the loop divisor value. This factor could limit the signal frequency multiplication (i.e. size of the loop divisor value) in a conventional synthesizer because the amount of noise in the system may reach intolerable levels. However, in the preferred embodiment a large loop divisor does not greatly enhance noise because the clean-up PLL provides a reference signal which is spectrally pure.

The loop bandwidth of PLL 220 may be set arbitrarily large because sufficient close-in noise is reduced by clean-up PLL 216. Primary PLL 222 is designed to perform frequency multiplication and relies on clean-up PLL 214 for enhancing spectral purity of the input signal. Generally, a PLL having a large loop bandwidth will have a much faster settling time (i.e. the time it takes for the PLL to "lock" onto a new frequency) than a similar PLL having a smaller loop bandwidth, such as clean-up PLL 214 or primary PLL 114 in FIG. 1. Specifically, a substantially larger loop bandwidth used by the primary PLL of the present invention provides significantly faster settling times than a similar primary PLL, such as PLL 114 used in synthesizer 100 in FIG. 1, having a smaller loop bandwidth. As a result, the present invention will have an overall faster settling time than conventional frequency synthesizer.

In operation, the DDS produces digitized periodic waveforms, typically sine waves, of a given frequency by accumulating phase values at a higher rate than the sine wave frequency. The accumulated phase is translated to a periodic waveform via a lookup table. The resulting digital representation of the periodic waveform is translated to analog form using a digital to analog converter.

The spurious performance of the preferred embodiment of the present invention is readily analyzed. The DDS output includes spurious signals typically caused by phase truncation of the output waveform, amplitude quantization of the waveform, nonlinearities of the DAC output, and aliases attributable to the sampling process. The phase noise in the DDS is governed by the phase noise characteristics of the DDS clock signal, as well as the noise performance of the digital circuitry comprising the DDS.

Clean-up PLL 214 filters out close-in frequency spurs in the signal generated by DDS 202. By designing clean-up PLL 214 with a very narrow loop bandwidth the typical harmonic family of spurs are drastically reduced and a spectrally pure frequency signal is generated by clean-up PLL 214. For additional details and examples on the effect of the PLL loop bandwidth reducing spurs from a DDS reference signal see U.S. Pat. No. 4,965,533 referenced above.

A clean-up PLL will remain in lock and require little settling time if the reference frequency signal generated by DDS 202 does not vary beyond $\Delta f_{po}$ shown in equation (1). The clean-up PLL 214 settling time consists only of the time delay for phase acquisition when frequency and phase lock are maintained. Adding a clean-up PLL 214 which remains in lock does not contribute substantially to the overall settling time of the synthesizer and adds, as will be seen, an additional degree of flexibility to the settling time equation. The following relationship describes the maximum change in frequency a PLL comprising either a digital phase or frequency detector, such as phase detector 116 in FIG. 1, can accommodate before "pulling out" of frequency lock:

$$\Delta f_{po} = 1.8(2\pi)(\delta+1)f_n \qquad (1)$$

where:

$\Delta f_{po}$ is the pullout frequency $\delta$ is the loop damping factor; and $f_n$ is the PLL natural frequency Even when the reference frequency does vary greater than $\Delta f_{po}$ the overall settling time for synthesizer 200 is improved using clean-up PLL 214 in conjunction with primary PLL 220. Clean-up PLL 214 has a small loop divisor value and thus PLL 214 output frequency range is roughly equal to the output bandwidth of DDS 204. In addition, clean-up PLL 214 has a very small loop bandwidth. Typically, a small loop bandwidth corresponds to a long frequency settling time. In clean-up PLL 214, however, because frequency changes are limited, the corresponding times to settle, if any, remain small. Therefore, even if clean-up PLL 214 breaks lock and must reacquire the signal, the time delay attributed to phase and frequency acquisition remains small.

In comparison, when synthesizer 100, shown in FIG. 1, must break lock and reacquire the reference signal produced by DDS 102 the overall frequency time delay will remain significantly larger. Given the same narrow loop bandwidth as PLL 214 in FIG. 2, PLL 114 in FIG. 1 utilizes a much larger loop divisor to produce an order of magnitude wider frequency range. When PLL 114 changes frequency the settling time can not be improved by increasing the loop bandwidth unless the designer is willing to sacrifice spectral purity. Therefore, settling time for a PLL to make large frequency changes takes longer than the settling time for a PLL to make small frequency changes when the loop bandwidth remains constant.

The preferred embodiment exemplified in synthesizer 200, in FIG. 2, decreases settling time in the primary PLL 220 by increasing the loop bandwidth as needed. Now when primary PLL 220 breaks lock the large loop bandwidth markedly improves the settling time and justifies any added complexity or costs involved with adding clean-up PLL 214. The increased settling time achieved in primary PLL 220 more than compensates for any settling time lost even when clean-up PLL 214 may break lock.

Using clean-up PLL 214 to produce a signal with high spectral purity adds a degree of freedom in the settling time equation. Primary PLL 220 can have a relatively large loop bandwidth, in comparison to conventional primary PLL devices, because the spurs on the incoming reference signal have been greatly reduced by the clean-up PLL. The large loop bandwidth used in combination by a large loop divisor in primary PLL 220, allows frequency synthesizer 200 to acquire signal lock quickly over a large frequency range. The additional degree of flexibility in the settling time equation provides a means for improved synthesizer design previously unavailable.

In practice, a conventional DDS driven PLL synthesizer design will compromise settling time in exchange for higher spectral purity. Therefore, a brief comparison between the settling times of the conventional synthesizer with the preferred embodiment with will make clear the overall benefit. For example, consider conventional DDS driven PLL synthesizer 100 in FIG. 1 where the DDS portion produces a reference frequency of 1 MHz, the primary PLL 114 loop divisor is equal to 1000 and $\Delta f_{po}$=25 kHz. The typical settling time, attributed primarily to the primary PLL, for this synthesizer will be approximately 5 msec. for a 25 MHz jump.

In the preferred embodiment, "clean-up" PLL 214, in FIG. 2, has a narrow loop bandwidth at least as narrow as primary PLL 114, in FIG. 1. In addition primary PLL 220 in FIG. 2 has a loop bandwidth significantly larger than the primary PLL 114 of FIG. 1. Consider the case of DDS driven PLL frequency synthesizer 200 where the DDS portion produces a reference frequency of 1 MHz, the clean-up PLL loop divisor is unity, the primary PLL loop divisor is equal to 1000 and $\Delta f_{po}$=25 kHz for both PLLs. In this case, the settling time for this synthesizer is only approximately 2 msec. for a 25 MHz jump. The larger loop bandwidth of primary PLL 220 in the preferred embodiment significantly improves frequency settling time over conventional synthesizers having a primary PLL with a smaller loop bandwidth. As previously mentioned, the clean-up PLL would contribute a small delay to the overall settling time even if the frequency step size were to exceed $\Delta f_{po}$ and the clean-up PLL were to break lock.

A DDS driven PLL frequency synthesizer having an additional cleanup PLL can be configured several ways to take advantage of the additional degree of flexibility in the settling time equation. In the first exemplary configuration of the embodiment, the loop divisor of the primary PLL is set to a predetermined value in response to a second frequency control signal 222. Clean-up PLL 214, as shown in FIG. 2, has a loop divider value, set by first frequency control 216, equal to 1 and a substantially small loop bandwidth. In the alternative, clean-up PLL need not include a loop divider and the output of its VCO coupled directly back to an input of its phase detector. The primary PLL 220 in FIG. 2 coupled to clean-up PLL 214 may have a large loop divisor, set by second frequency control 222, fixed at 1000 and a loop bandwidth much larger than clean-up PLL 214. A reference frequency of 1 MHz provided by DDS 202, responsive to fine frequency control 212, can be adjusted up or down 25 kHz around the reference frequency. The resulting synthesizer, in this case, will have high spectral purity, due to the narrow loop bandwidth of PLL 214 and unity loop divisor, as well as fast frequency switching times, due to the large loop bandwidth of primary PLL 224. However, the frequency output range, obtained by multiplying the input reference frequency by the primary PLL loop divisor, will be fixed at 50 MHz.

A second configuration of the invention improves the frequency range by varying, rather than fixing, the loop divisor value in primary PLL 220. As before, clean-up PLL 214 has a loop divider value substantially equal to 1 and a relatively small loop bandwidth. The corresponding primary PLL 224, also has a large loop bandwidth but now includes a variable loop divisor. For example, frequency control 222 may be used to vary primary PLL loop divisor from 100 to 200. A reference frequency of 5 MHz provided by DDS 202 is responsive to fine frequency control 212 used to adjust up or down 25 kHz around the reference frequency. As previously discussed, the resulting synthesizer will have high spectral purity, due to the narrow loop bandwidth and unity loop divisor of PLL 214, as well as fast frequency switching times, due to the large loop bandwidth of primary PLL 224. Now, however this embodiment will function over a broader range of frequencies dictated by dynamically setting the primary loop divisor. The output frequency range from 500 MHz to 1 GHz and will have an average settling time of approximately 2 msec.

The variable loop divisor configuration may also have an output signal with fine frequency resolution capabilities. The primary loop divisor is used as a coarse frequency control while the DDS frequency control is used selected all the frequencies in between. Generally, the resolution of the output frequency is proportional to the DDS frequency resolution times the current loop divisor value. A typical DDS having a 32 bit accumulator will produce an output frequency having a 0.93 Hz resolution when the primarily PLL loop divisor is 200. Lower loop divisor values will enable even finer frequency resolution adjustments. When the PLL loop divisor is set to 100 the frequency resolution is increased to 0.465 Hz.

Figure 3:
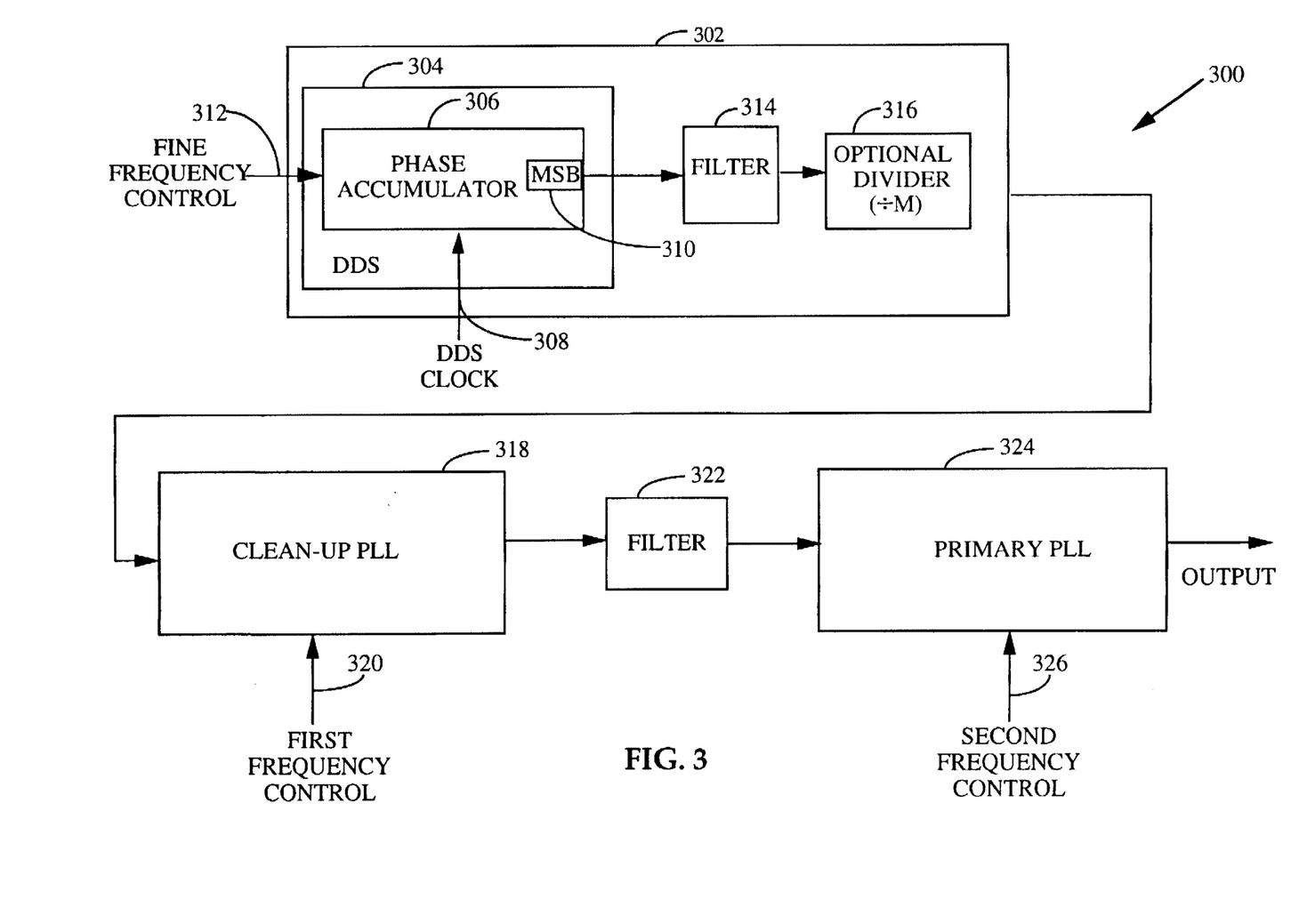
FIG. 3 illustrates a first alternative embodiment of the DDS driven PLL of the present invention.

FIG. 3 illustrates in block diagram form an alternate embodiment of the present invention utilizing a clean-up PLL 318 to obviate the need for various components. In FIG. 3, synthesizer 300 includes a frequency synthesizer 302, a clean-up PLL 318 and a primary PLL 324.

In this embodiment, synthesizer 302 comprises a DDS 304, a filter 314 and an optional divider 316. Of particular interest is that DDS 304 may only require phase accumulator 306 to operate if a clean-up PLL is also utilized. A sine lookup table, such as sine lookup table 106 in FIG. 1, and a digital to analog converter (DAC), such as DAC 108 in FIG. 1, are not needed in this implementation. Phase accumulator 306 receives a digital fine frequency control signal which determines the phase increment for accumulation at the DDS clock rate. A most significant bit (MSB) or overflow bit 310 passes through filter 314 and optional divider means 316 before being provided to clean-up PLL 318.

MSB 310 is coupled, through either filter 314 or optional divider 316, to a clean-up PLL 318 having similar components and operation as clean-up PLL 214 in FIG. The input signal generated by MSB 310 clearly indicates when the amplitude of the synthesized periodic signal has changed inflection despite possible distortion in the actual sinusoidal wave. The phase detector in PLL 318 is responsive to changes in MSB 310. Effectively, clean-up PLL 318 receives the input signal generated by MSB 310 and perceives a "square wave" or truncated sinusoidal. Phase errors that may be present, are inherently corrected by the narrow bandwidth of the clean-up PLL 318. The resulting output signal from clean-up PLL 318 appears to be a sine-wave.

The output from clean-up PLL 318 is coupled to a primary PLL 324 and may have a filter 322 located therebetween. Primary PLL 324 is used as a frequency tuning means for generating a loop output signal having a periodic frequency which is an integer multiple of the frequency of the input reference signal. The components and operation of primary PLL 324 are similar to those of primary PLL 214 illustrated in FIG. 2.

Clean-up PLL 318 effectively produces what appears to be a sine wave signal using only MSB 310. The sine wave produced by clean-up PLL 318 is sufficient to drive the phase detector in primary PLL 324. Therefore, this embodiment obviates the need for sine look-up table, such as sine took up table 106 in FIG. 1, and digital to analog converter, such as digital to analog converter 108 in FIG. 1. Utilizing a reference signal generated by MSB 306 in combination with clean-up PLL 318 has the advantages of lower costs and reduced complexity.

Figure 4:
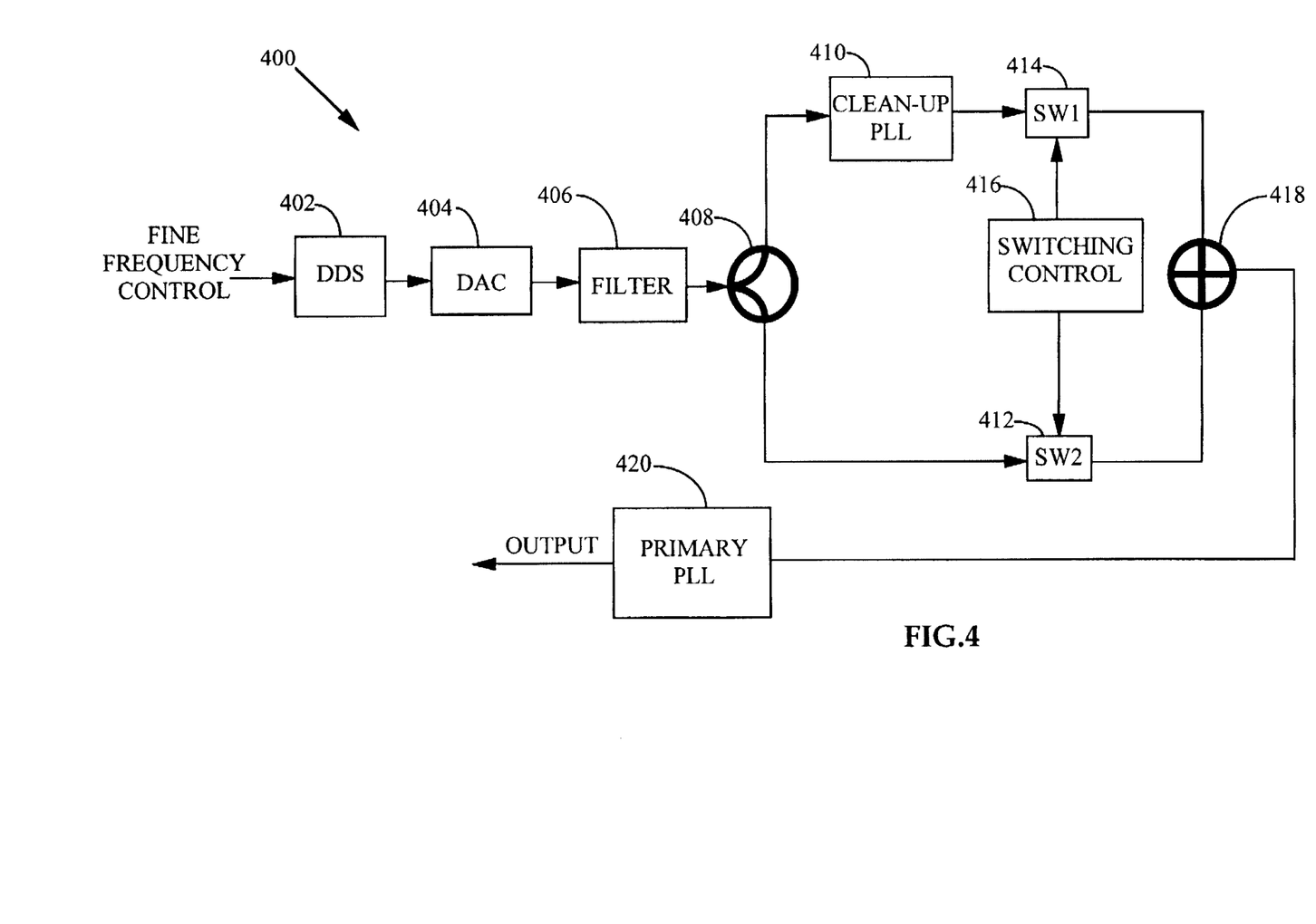
FIG. 4 illustrates a second alternative embodiment of the DDS driven PLL of the present invention.

FIG. 4 illustrates in block diagram form yet another alternate embodiment wherein a DDS driven PLL frequency synthesizer with a clean-up PLL used in combination with a switching apparatus can be used to further improve overall settling time when switching frequencies. In FIG. 4, frequency synthesizer 400 includes a DDS 402, a digital to analog converter (DAC) 404, a filter means 406, a power splitter 408, a clean-up PLL filter 410, switch SW1 414, switch SW2 412, a switching control means 416, a summer 418 and primary PLL 420.

Direct digital synthesizer (DDS) 402 serves as a variable reference source means for generating a selected one of a plurality of reference frequency signals. The operation and components of DDS 402 are similar to DDS 204 as illustrated in FIG. 2. The output of DDS 402 is coupled with DAC 404 whose operation is also similar to DAC 206 also in FIG. 2.

Spectral purity of signal produced by DDS 402 may optionally be enhanced utilizing filter 406. The output from DAC 404 is coupled to filter 406 to reduce wide band noise and also improve signal quality when cleanup PLL 410 may not be engaged.

The output of DAC 404 or optionally filter 406 is coupled to the input of a power splitter 408 which distributes the signal into two separate branches. The output of the first branch from splitter means 408 is coupled to a clean-up PLL 410. The operation and components of clean-up PLL 410 are similar to clean-up PLL 214 as illustrated in FIG. 2. A switch 414 is responsive to a switching control means 416 and receives the output from clean-up PLL 410. The resulting output from switch 414 is coupled to one input of summer 418.

The output of the second branch from splitter means 408 is coupled to switch 412. The output from switch SW2 412 is then also coupled to a second input of summer 418. The output from summer 418 is then provided to primary PLL 420.

This embodiment describes a switching technique to further reduce the settling time of the present invention when switching frequencies. Prior to switching frequencies, switching control means 416 will close switch 412 and open 414. After the frequency is changed, switching control means 416 will delay a predetermined time necessary for clean-up PLL 410 to lock onto the new frequency. Once clean-up PLL 410 has settled onto the new frequency, switching control means will close switch 414 and then open switch 412. Preferably, a make before break technique is used between switches SW1 414 and SW2 412 to minimize switching noise and signal discontinuities.

Primarily, this switching technique reduces any settling time which may be introduced by a clean-up PLL by bypassing PLL 410. In this embodiment, the overall frequency switching time will be limited to only the settling time of primary PLL 420. It should be noted that while switch 414 remains open and switch 412 closed, spurious signals may be output from summer 418 and into primary PLL 420. Typically, the spurious signals that are transmitted are confined to the loop bandwidth of primary PLL 420 and are of minimal duration.

The previous description of the preferred embodiments is provided to enable any person skilled in the art to make or use the present invention. The various modifications to these embodiments will be readily apparent to those skilled in the art, and the generic principles defined herein may be applied to other embodiments without the use of the inventive faculty. Thus, the present invention is not intended to be limited to the embodiments shown herein but is to be accorded the widest scope consistent with the principles and novel features disclosed herein.

I claim:

1. A frequency synthesizer comprising:
   a frequency source for digitally generating a variable frequency signal;
   a first phase lock loop circuit having a first predetermined loop bandwidth coupled to said frequency source;
   a second phase lock loop circuit having a second predetermined loop bandwidth greater than said first predetermined loop bandwidth coupled to said first phase lock loop circuit;
   a power splitter disposed between said frequency source and said first phase lock loop circuit, said power splitter having an input and first and second outputs, said power splitter input coupled to an output of said frequency source and said power splitter first output coupled to said first phase lock loop circuit;

a first switch, responsive to a first switch control signal, disposed between said first phase lock loop circuit and said second phase lock loop circuit;

a summer disposed between said first switch and said second phase lock loop circuit, said summer having first and second inputs and an output, said summer first input coupled to said first switch and said summer output coupled to said second phase lock loop circuit; and a second switch, responsive to a second switch control signal, coupled to said power splitter second output and said summer second input.

2. The frequency synthesizer of claim 1 further comprising a switching control circuit having first and second outputs respectively coupled to said first and said second switches.

3. The frequency synthesizer of claim 2 wherein said switching control circuit generates first and second pairs of switch control signals which are provided to said first and second switches and wherein said first and second switches are responsive to said first pair of switch control signals for closing said second switch and opening said first switch, and responsive to said second pair of switch control signals for closing said first switch and opening said second switch.

4. The frequency synthesizer of claim 3 wherein said first and second switches are responsive to said first pair of switch control signals by, in sequence, closing said second switch then opening said first switch.

5. The frequency synthesizer of claim 3 wherein said first and second switches are responsive to said second pair of switch control signals by, in sequence, closing said first switch then opening said second switch.

6. A method of frequency synthesis comprising the steps of:

digitally generating a variable frequency reference signal;

splitting said variable frequency reference signal into a first branch reference signal and a second branch reference signal;

filtering said first branch reference signal in a first phase lock loop circuit having a first predetermined loop bandwidth;

applying said filtered first branch reference signal to a reference input of a second phase lock loop circuit having a second predetermined loop bandwidth in response to a first switch control signal; and applying said second branch reference signal to said reference input of said second phase lock loop circuit in response to a second switch control signal.

7. The method of claim 6 wherein said first predetermined bandwidth is less than said second predetermined bandwidth.

8. The method of claim 6 wherein said first predetermined bandwidth is substantially equal to unity.

* * * * *